United States Patent [19]

de Kanter

[11] 4,407,136

[45] Oct. 4, 1983

[54] DOWNHOLE TOOL COOLING SYSTEM

[75] Inventor: Scipio de Kanter, Missouri City, Tex.

[73] Assignee: Halliburton Company, Duncan, Okla.

[21] Appl. No.: 363,327

[22] Filed: Mar. 29, 1982

[51] Int. Cl.³ ............................................. F25D 17/02
[52] U.S. Cl. ........................................ 62/64; 62/119;
62/376; 62/514 R; 165/104.21
[58] Field of Search .............. 62/63, 374, 514 R, 376, 62/375, 119, 64; 165/104.21

[56] References Cited

U.S. PATENT DOCUMENTS

| | | | |
|---|---|---|---|
| 2,561,738 | 7/1951 | Hill | 62/64 |
| 3,435,629 | 4/1969 | Hallenburg | 62/514 R |
| 4,056,949 | 11/1977 | Hahn | 62/64 |
| 4,107,937 | 8/1978 | Chmiel | 62/64 |

Primary Examiner—Ronald C. Capossela
Attorney, Agent, or Firm—William J. Beard

[57] ABSTRACT

The two preferred and illustrated embodiments set forth downhole tool cooling systems. In a downhole oil well tool exposed to extremely high working temperatures, a cooling system is provided for the printed circuit boards and various electronic components thereon. In one embodiment, the cooling system incorporates a closed container having a bottom located sump, a pump for picking up and pumping liquid refrigerant from the sump, and a distribution line extending from the pump to spray the PC boards with refrigerant. Cooling is accomplished on vaporization, and refrigerant flows back to the bottom as it condenses. In the alternate embodiment, no pump is included. Rather, a heat sink is included at the top of a closed and thermally isolated chamber. The bottom includes a sump for refrigerant. In between, a mesh distributes droplets of condensing liquid over the surfaces of the PC boards to accomplish cooling.

5 Claims, 2 Drawing Figures

DOWNHOLE TOOL COOLING SYSTEM

BACKGROUND OF THE DISCLOSURE

In a downhole oil well logging tool, electronic circuitry is routinely exposed to very high ambient temperatures. The temperature in an oil well increases with depth. Regretably, most electronic components used in the electronics placed in downhole tools are degraded with increasing temperature, and the increase in temperature markedly limits the performance of the components. Heating of electronic components in a downhole tool never occurs uniformly among the many components. Inevitably, one circuit component will run relatively cool while the current flow through another component will heat that component to fairly high temperatures. The performance of the circuit, considered as a whole, is severely degraded by the heating of a single component notwithstanding all the other components are operated several degrees cooler. This inevitably poses a problem in cooling the hottest component.

There are space and access limitations within a downhole wireline oil well tool. Such tools are typically constructed with elongate cylindrical bodies, and the electronic components are normally mounted therein on printed circuit boards (PC boards hereafter). They are normally rectangular boards, typically mounted in a vertical position within the tool, sometimes arranged with two or three parallel layers between transverse wafers or bulkheads. Often, a downhole tool will be divided into various and sundry compartments by the wafers or bulkheads. This severely limits air circulation around components. While air can provide modest cooling, convection cooling is usually very limited by physical constraints. Radiation cooling is likewise very limited in effectiveness. Attempts have been made in the past to cool downhole equipment. For instance, Hallenburg has disclosed in U.S. Pat. Nos. 3,435,629 and also 3,488,970 approaches to this problem. The latter patent has a heat transfer system including the Peltier effect with a water sump. The earlier Hallenburg reference describes a pump with two separate chambers for the coolant liquid.

The most recent patent of Lamers, et al, U.S. Pat. No. 4,248,298 shows a cooling system using a surface reservoir. The full flow path extends from surface to downhole tool, and back to the surface. This is practically impossible of construction because it would require conduits in a logging cable up to perhaps 25,000 feet in length. The recent Rothwell patent, U.S. Pat. No. 4,224,805, shows a surface refrigeration system with certain downhole cooling as set forth in that disclosure.

By contrast, this apparatus locates a sump immediately below PC boards to be cooled. In actuality, the PC boards are not cooled; really, the electronic components which are mounted on them are cooled. It is convenient, however, in speaking of a PC board to refer to an installed board with the components on it, the components typically comprising integrated circuits, transistors, capacitors, resistors and the like.

This apparatus cools a PC board by positioning a sump for a liquid refrigerant therebelow. The refrigerant is brought, as a liquid, to the PC board. It is sprayed, splashed or dripped onto the PC board for cooling. Cooling is accomplished with a change in phase. The vapor liberated by absorbing heat is collected in the near area and is subsequently condensed. In one embodiment, it is condensed by a surrounding metallic shell isolating the chamber above the sump, and the condensing liquid runs down the interior surface of the shell to collect in the sump. In another embodiment, a heat sink capable of absorbing heat cools the refrigerant vapors to condense on the outer surface. In both cases, a refrigerant flow cycle is incorporated, beginning with liquid in the sump, cooling of electronic components by applying liquid to them on the PC boards, vaporization of the refrigerant applied to the components, and condensation of the vapor to form a liquid which is again returned toward the sump.

BRIEF DESCRIPTION OF THE DRAWINGS

So that the manner in which the above recited features and advantages of the invention, as well as others, which will become apparent, are attained and can be understood in detail, a more particular description of the invention, briefly summarized above, may be had by reference to the embodiments thereof illustrated in the appended drawings, which drawings form a part of this specification. It is to be noted, however, that the appended drawings illustrate only typical embodiments of the invention and are not to be considered limiting of its scope, for the invention may admit to other equally effective embodiments.

DETAILED DESCRIPTION OF THE PREFERRED EMBODIMENT

Figure 1:
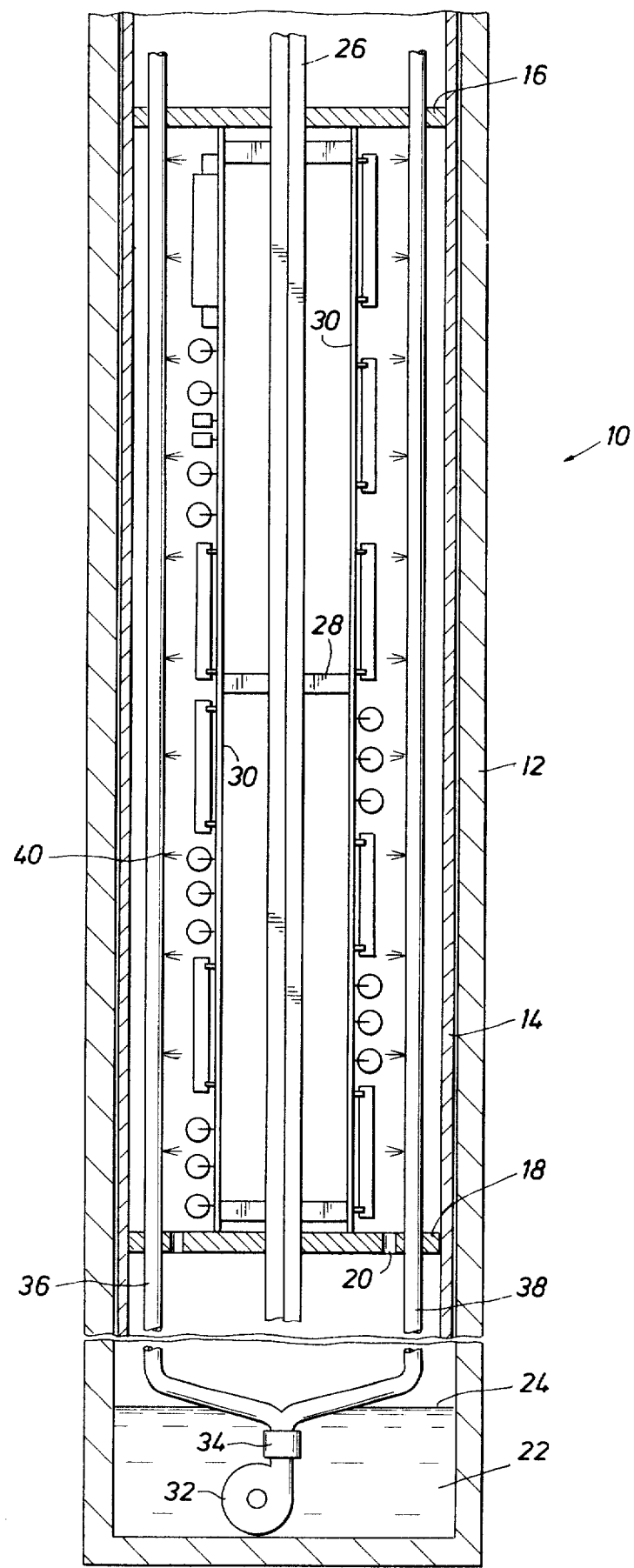
FIG. 1 is a sectional view through a downhole tool illustrating a first embodiment of the PC boaard cooling apparatus of this disclosure and showing a system for distributing liquid refrigerant to be vaporized while cooling electronic components.

Attention is first directed to FIG. 1 of the drawings. The numeral 10 identifies a portion of a downhole wireline oil well logging tool which incorporates electronic components to be cooled and wherein the cooling is accomplished by the inventive refrigerant circulation system to be described. Power is supplied to the downhole tool by wireline (not shown) from the surface of the earth. The numeral 12 identifies the outer shell or cylindrical pressure housing of the tool. The tool has upper portions which have been omitted from the drawing but which, at least, include means for connecting with a wireline logging cable or the like. There may also be lower portions to the tool which have been omitted, and they too may include various components of an electrical or mechanical nature which are not important to this disclosure. The tool shown in FIG. 1 is cylindrical having a diameter sufficient to permit it to be placed in a wellbore. There may be additional wires, conduits and the like extending from below to above the tool portion 10 shown in FIG. 1, and they also have been omitted for sake of clarity. Principally, FIG. 1 sets forth a portion of the tool which includes a number of PC boards and a cooling system for that portion. FIG. 1 is not inteneded to be a complete disclosure of a wireline logging tool, and merely sets forth the context in which the PC boards and the associated electronic components are cooled.

The numeral 14 identifies an internal metallic housing or shell. It is a thin wall partially open cylinder adapted to enclose the entire system. It is preferably made of metal to conduct heat with some degree of efficiency.

The shell 14 is divided into compartments for structural purposes. A transverse bulkhead or wafer 16 defines the upper end of the compartment. The refrigeration system, to be described, can be isolated in the tool 10, below the wafer 16; alternately, it can be used to cool other compartments above the wafer 16 by simply extending the refrigeration apparatus above the wafer. For instance, this system can cool two, three or more consecutive compartments filled with PC boards. This can be accomplished by placing PC boards in all of the compartments and extending the refrigerant distribution means and return means as will be described.

A lower wafer 18 is parallel to the first wafer 16, and the two wafers define a cylindrical compartment that is partially open to the outer case 12. Wafer 18 can have one or several holes or ports 20 to allow the excess condensed refrigerant to flow back to the sump 22. The sump area receives a volume of liquid refrigerant in it. The liquid refrigerant is identified by the number 24. The vapor that is formed when the liquid refrigerant cools the electronic components will exit the cylindric compartment through the openings left between the two shells 14 and will then condense on the outer case 12 and flow down into the liquid sump 22.

FIG. 1 further discloses a longitudinal mounting plate 26 which extends through the chamber. Typically, facing mounting plates are included. Standoff posts 28 are anchored to the mounting plates. They, in turn, support PC boards 30. In the arrangement shown in FIG. 1, there are two PC boards. One is located on the left and the other is on the right of mounting plate 26. They are generally rectangular in shape, and they are mounted parallel to one another. The number of PC boards can be increased while observing practical limits. In the arrangement, shown in FIG. 1, of the PC boards, the components are mounted facing outwardly. It is preferable that the electrical components face the liquid refrigerant distribution system so that the components are cooled with refrigerant. On occasion, it may be necessary to cool the bottom face of the PC board; usually, this is not required. At times, PC boards are equipped with components on both faces. Again, this is a matter of design choice of the PC board. The refrigeration system of this invention may be constructed and arranged to accommodate all variations in PC board component packing, PC board deployment, PC board shape and size.

At the lower portion of FIG. 1, a pump 32 is included. It is a small pump which has an inlet for receiving liquid refrigerant. It has an outlet 34. That, in turn, connects with a first conduit 36. A second conduit is identified by the numeral 38. The number of conduits can be varied depending on distribution of the refrigerant. The conduits may branch from one to several depending on the PC board quantity and configuration. The conduits 36 and 38 extend upwardly. In lieu of conduits 36 and 38 as shown, two thin walled internal cylindrical shells, similar to shell 14, could be used, if desired. One such cylinder is nested inside the other with an annulus between the two such that the pump 32 could move the refrigerant 24 upward through this annulus.

Conduits 36 and 38 are provided with a plurality of small holes at 40. The small holes 40 serve as sprinkler holes. Liquid refrigerant 24 is pumped by the pump 32 through the conduits 36 and 38 and through the spray ports or holes 40. Preferably, the pressure is sufficiently high that liquid refrigerant 24 is sprayed out of the holes. The holes 40 are preferably arranged facing the component sides of the PC boards. This may require deployment of holes on one side of the conduits. An alternate arrangement is to place holes about the circumference of the conduit in the event a central conduit faces PC boards on all sides. Alternatively in the parallel thin shell arrangement, the inner shell is provided with spray ports. It is possible, for instance, to make curved PC boards. In that instance, the components might be mounted on the interior of such curved boards, and a single conduit arranged coaxially concentric with the curved PC board. Another alternate arrangement is placing two PC boards facing one another and position a single central conduit therebetween having holes facing the component side of the two PC boards.

The spray ports or holes 40 are sufficiently small that liquid refrigerant is actually sprayed therethrough. It does not merely weep out of the holes 40; rather, it is forced, with some pressure, so that spray droplets form on the surface of the PC boards and components confronting the two conduits. The sprayed liquid refrigerant will collect on the PC board and trickle downwardly by gravity. At this point, it should be noted that the PC board is normally built with components only on one side. On the component side, a conventional conformal coating (not shown) is placed. This is a type of liquid barrier and protects the PC boards and components from chemical interaction with the refrigerant 24. This arrangement of a conformal coating does not inhibit the transfer of heat. Rather, the plastic material used to fabricate the conformal coating preferably transfers heat readily. Moreover, the conformal construction makes the barrier snug up against the components so that the plastic conformal coating is heated as the components are heated. This is especially true where selected components tend to heat more rapidly, as, for instance, a large load resistor.

The liquid refrigerant trickles over the surface of the PC board and is in close contact to the heated electronic components. The electronic components give off heat to the liquid refrigerant. This absorption of heat, by the refrigerant 24, initiates a change of phase, and the chamber between the wafers 16 and 18 is then filled with vaporized refrigerant. As the vapor levels increase, the vapor will exit through the openings left in the shell 14. The vapor will condense on the outer case 12 and trickle downwardly. The rate of condensation is dependent on many factors including the temperature of the outer shell, the pressure within the chamber, the particular refrigerant, and other factors. As condensation occurs, the liquid condensate runs down the sides of the outer case into the sump.

A certain portion of the liquid refrigerant sprayed onto the PC boards will not vaporize. Rather, it will simply run down the PC boards and collect on the bottom bulkhead or wafer 20. It also is returned to the sump. After the device has been operating for a period of time, a certain portion of the refrigerant will remain in vapor phase. There is a continuous flow as refrigerant completes the cycle of vaporization and condensation. This cycle continues as heat is removed from the hotter electronic components. The components are cooled towards an ambient temperature established by many factors including the external borehole temperature around the outer pressure housing 12 of the tool. Heat is surrendered through the pressure housing 12 to the surrounding borehole to carry on the process.

If desired, the arrangement shown in FIG. 1 can be extended to multiple compartments. This requires extension of the conduits 36 and 38. It also requires that the top bulkhead or wafer 16 be perforated so that liquid refrigerant is returned from the topmost compartment to the sump 22. This path of return need not be precisely defined. It is sufficient that the liquid refrigerant is dripped from compartment to compartment in the tool. If the droplets falling from a top wafer are intercepted by PC boards in the chamber below, no particular harm arises. It merely enhances the wetting of components in the lower chambers.

Selection of the refrigerant is important dependent on the operating temperatures to be accomplished and the downhole temperature. This is a variable which can be obtained by mixing different fluorocarbon refrigerants including well known freon (a trademark refrigerant of E. I. DuPont Co.). Distilled water could also be used if desired. Whatever the case, cooling is accomplished by the change of phase refrigerant 24 which, in turn, is correlated to the variables mentioned above.

Figure 2:
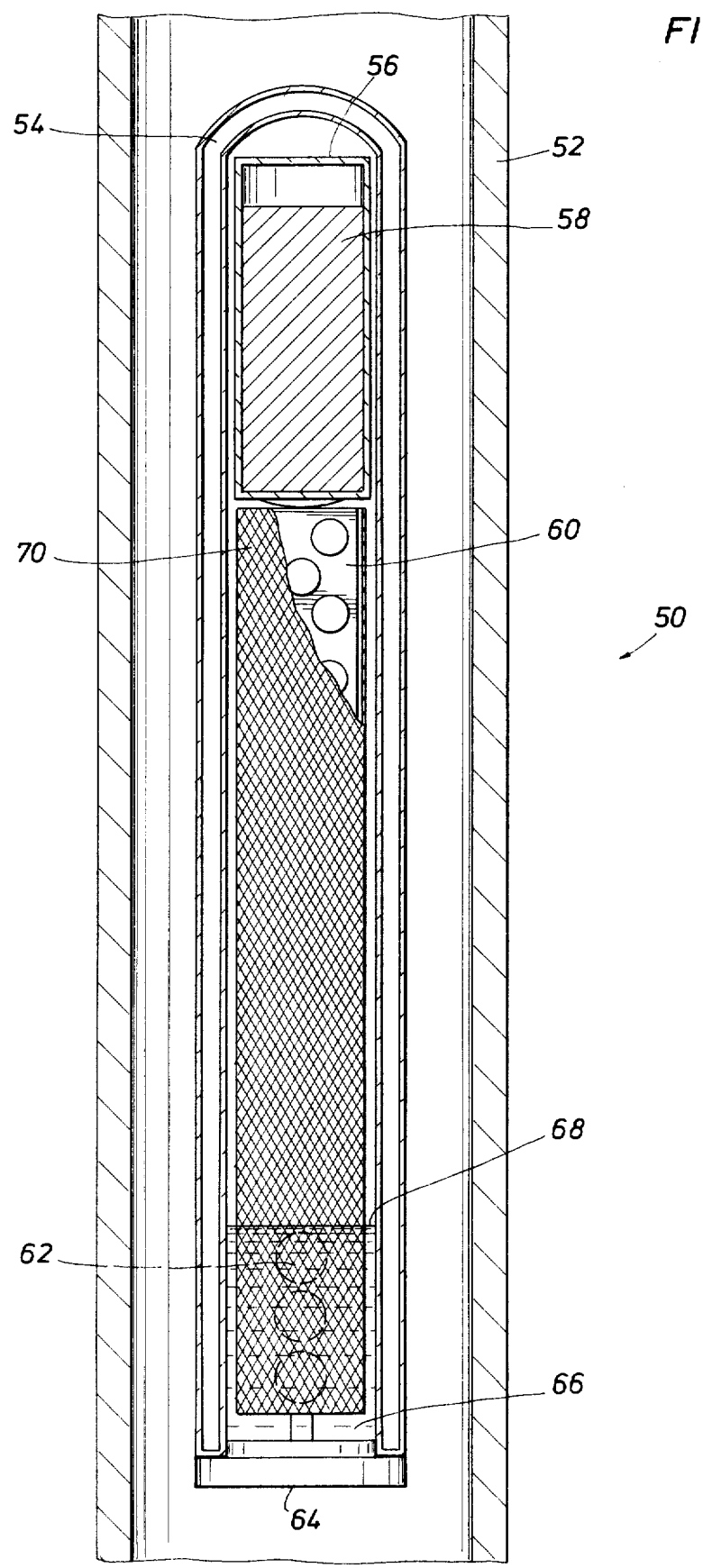
FIG. 2 is an alternate embodiment to the structure shown in FIG. 1 illustrating a liquid refrigerant coolant system which vaporizes the liquid refrigerant.

In the alternative embodiment of FIG. 2, the numeral 50 identifies that portion of the tool which incorporates the liquid refrigerant cooling system of this disclosure. Again, it will be understood that the tool may be much longer having other portions which are not pertinent to this disclosure. The portion shown in FIG. 2 includes the electronic circuitry. Wires and conductors have been omitted for sake of clarity. Other components, within the downhole tool, have likewise been omitted. The numeral 52, therefore, identifies the outer wall of the downhole tool. It encloses a thermos chamber 54 which is an elongate cylindrical housing. It is sealed to prevent entry of heat from the exterior. The thermos container encloses a volume of space sufficient to receive one or more PC boards. They are deployed in a longitudinal orientation. On the interior, a heat sink housing 56 is illustrated. It is a cylindrical container made of some suitable metal. The metal walled sink 56 holds a specified quantity of alloy or, alternatively, a thermoelectric material. The alloy on the interior may be a eutectic alloy which, by definition, includes two or more metals which have been alloyed in a suitable proportion to obtain a specified melting temperature lower than the melting temperature of the individual metals comprising the alloy. Heat is absorbed by the eutectic alloy or thermoelectric material 58. Heat is absorbed on transfer through the wall of the housing 56 which contains the eutectic alloy.

A PC board is identified at 60. It supports a number of electronic components. In the arrangement of FIG. 2, it is preferably constructed with the hottest components at the bottom. To this end, a large power transistor 62 is identified in the drawings. The transistor 62 is one of the hottest components on the board. The hottest components are grounded at the lower end of the PC board. Typically, a circuit, such as this, could include large load resistors. It may also include transformers. Another typical component is a large output transistor and such an example is set forth in FIG. 2. The precise nature of the components is not particularly important; the more important factor is the fact that the hotter components in the circuit supported on the PC board 60 are located at the bottom.

The housing 54 is closed by a plug 64 across the bottom. This defines a sump area 66. Liquid refrigerant is accumulated at 68. The liquid refrigerant initially is sufficiently deep that it covers over the components 62, those which are the hottest. The hot compoments raise the temperature of the liquid refrigerant at the sump. The liquid refrigerant, upon absorption of heat, is eventually vaporized, at least to some extent. The vapors rise within the closed housing. The vapors are exposed to all the surfaces in the housing. Depending on temperature, the vapors eventually condense on the eutectic metal or thermoelectric material heat sink 56. In other words, they transfer heat to it and condense on it because it is a cooler surface. The condensed vapors collect on the housing 56 at the top end of the chamber. The condensed vapors become droplets of refrigerant clinging to the surface of housing 56. As they collect, they coalesce and eventually flow downwardly and fall off the heat sink 56 onto a mesh or wick 70.

The mesh 70 has the form of a mesh sleeve. The mesh sleeve 70 surrounds the PC board 60. Preferably, the mesh is formed of some woven, open weave regular mesh material having the form of a flexible tube or sock. It is preferably extended right up to the bottom of the heat sink 56. It has been omitted in the upper portion of FIG. 2 for sake of clarity in showing the interior of 56. The mesh, however, does extend close to the heat sink 56. Droplets which collect and run down the outer surface of the heat sink 56 are then transferred to the mesh 70. The mesh 70 functions similarly to a wick, picking up these droplets and transporting them downwardly due to surface tension effects. The mesh provides multiple random paths of flow for the condensed liquid refrigerant. The mesh 70 is flattened against the PC board. The components, on the PC board, do not actually touch the mesh; the components are preferably covered over with a conformal protective coating as previously described with respect to FIG. 1. Even so, the heated components transfer heat through this conformal coating quite easily, and the liquid droplets of refrigerant carried by the mesh 70 are transferred at many points of contact to the PC board and components. Imagine a pair of PC boards with components mounted on them. The components face outwardly. If the PC boards are three inches in width, they are preferably spaced apart so that the mesh fits loosely across the components. This then distributes the liquid refrigerant back onto the PC board so that it can trickle down on the components of that board.

The cycle of vapor flow in the embodiment of FIG. 2 includes the following paths. Initially, vapor is emitted from the sump by heating at the hotter components 62. This vapor condenses in the upper portions of the apparatus as on the heat sink 56. As it condenses and trickles back downwardly, a certain portion of it is again vaporized in the middle portions of the compartment protected by this refrigeration system and again rises to the upper parts of the chamber. After a an equilibrium is achieved, there will be a continual flow and reflow of liquid refrigerant including vaporization from the sump area at 66 and also from the components mounted on the board along the full length of the PC board 60. There is a continuous flow from any hot source within the protected chamber, and continuous cooling is provided at the heat sink.

Representative operational parameters may specify vaporization for the refrigerant at 160° C. The heat sink has a eutectic temperature of perhaps 2°-10° C. cooler. Again, the precise refrigerant mix can be adjusted to achieve a required temperature for vaporization. The differential between refrigerant vaporization temperature and the eutectic alloy temperature can be adjusted by selection of the refrigerants and alloy metals.

The embodiment of FIG. 2 can be scaled to larger and smaller arrangements in a manner similar to the embodiment of FIG. 1. This is a matter of scaling, and may encompass only one PC board or as many as can be fitted within the chamber. The thermos chamber 54 can be made larger if desired.

Again, it should be emphasized that FIGS. 1 and 2 both omit a number of support structure components for the downhole tools including conduits, electrical conductors, mounting brackets, and other parts which have been omitted for sake of clarity.

While the foregoing is directed to the preferred embodiments, the scope is determined by the claims which follow.

I claim:

1. A method of cooling electronic components in a downhole tool comprising the steps of:
    (a) initially filling a sump within a downhole tool with liquid refrigerant;
    (b) moving a portion of the refrigerant from the sump to be applied directly to the surfaces of electronic components in a chamber above the sump by vaporizing said refrigerant in said sump by contacting said liquid refrigerant in said sump directly with at least some of said electronic components;
    (c) constraining the flow of vapor from the liquid refrigerant vaporized by absorbing heat from said electronic components, and directing the vapor against a cooling surface means to be converted into droplets of condensed refrigerant; and
    (d) flowing said condensed refrigerant droplets across said electronic components and vaporizing the liquid refrigerant to cool said components.

2. The method of claim 1 wherein said cooling surface is an electrically operated cooling surface as a thermoelectric device.

3. The method of claim 1 wherein the step of cooling said electronic components by vaporizing the liquid refrigerant to be applied directly to the surface of said components includes flowing liquid refrigerant under the influence of gravity flow along surfaces of an open weave mesh directly contacting said electronic components.

4. The method of claim 3 wherein said cooling surface means comprises a closed housing containing a material absorbing heat on achieving a change of state from solid to liquid.

5. The method of claim 4 wherein said absorbing material comprises a eutectic alloy having a melting temperature cooler than the temperature of vaporization of said refrigerant.

* * * * *